(12) United States Patent
Mizutani et al.

(10) Patent No.: US 11,822,579 B2
(45) Date of Patent: Nov. 21, 2023

(54) APPARATUS FOR FUNCTIONING AS SENSOR NODE AND DATA CENTER, SENSOR NETWORK, COMMUNICATION METHOD AND PROGRAM

(71) Applicant: NIPPON TELEGRAPH AND TELEPHONE CORPORATION, Tokyo (JP)

(72) Inventors: Shin Mizutani, Tokyo (JP); Yasue Kishino, Tokyo (JP); Yoshinari Shirai, Tokyo (JP); Takayuki Suyama, Tokyo (JP); Hiroshi Sawada, Tokyo (JP); Futoshi Naya, Tokyo (JP); Yutaka Yanagisawa, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 352 days.

(21) Appl. No.: 17/254,142

(22) PCT Filed: May 14, 2019

(86) PCT No.: PCT/JP2019/019083
§ 371 (c)(1),
(2) Date: Dec. 18, 2020

(87) PCT Pub. No.: WO2019/244513
PCT Pub. Date: Dec. 26, 2019

(65) Prior Publication Data
US 2021/0263954 A1    Aug. 26, 2021

(30) Foreign Application Priority Data

Jun. 22, 2018 (JP) .................................. 2018-119234

(51) Int. Cl.
*G06F 16/28* (2019.01)
*G06N 3/04* (2023.01)
*G06N 3/08* (2023.01)

(52) U.S. Cl.
CPC ............. *G06F 16/285* (2019.01); *G06N 3/04* (2013.01); *G06N 3/08* (2013.01)

(58) Field of Classification Search
CPC .. G06F 16/285; G06F 18/217; G06F 2218/00; G06F 9/3016; G06F 18/2413;
(Continued)

(56) References Cited

U.S. PATENT DOCUMENTS

2018/0082150 A1  3/2018 Itou et al.
2018/0275642 A1* 9/2018 Tajima .................. G06Q 50/10
(Continued)

FOREIGN PATENT DOCUMENTS

| JP | H0795576 A | 4/1995 |
|---|---|---|
| JP | 201316006 A | 1/2013 |
| JP | 20164549 A | 1/2016 |
| JP | 20186964 A | 1/2018 |
| JP | 201849355 A | 3/2018 |

OTHER PUBLICATIONS

Nasridinov et al. (2014) "Event Detection in Wireless Sensor Networks: Survey and Challenges" Mobile, Ubiquitous, and Intelligent Computing, vol. 274 pp. 585-590.
(Continued)

*Primary Examiner* — Evan Aspinwall

(57) ABSTRACT

Provided is a sensor network capable of acquiring, from a data center, learning data composed of a pair of sensor data (input) and a classification label (output) necessary for adding/changing a classification label for updating a classifier while reducing the volume of communication between a sensor and the center. One aspect of the present invention relates to a sensor network, including one or more sensor nodes and a data center. The sensor node includes: an (Continued)

encoding unit for encoding sensor data by an encoder part of an autoencoder; and a transmission unit for transmitting the encoded data. The data center includes: a reception unit for receiving data encoded from sensor data by the encoder part of the autoencoder; a decoding unit for decoding the encoded data by a decoder part of the autoencoder; and a storage unit for storing the decoded data therein.

20 Claims, 21 Drawing Sheets

(58) Field of Classification Search
CPC . G06F 30/27; G06N 3/04; G06N 3/08; G06N 20/00; G06T 2207/20081; G06T 7/0002; G06T 7/00; G06V 10/764; G06V 10/82
USPC .......................................................... 707/737
See application file for complete search history.

(56) References Cited

U.S. PATENT DOCUMENTS

| | | | | |
|---|---|---|---|---|
| 2018/0336463 | A1* | 11/2018 | Bloom | G06N 3/08 |
| 2018/0365089 | A1* | 12/2018 | Okanohara | G06F 11/0703 |
| 2019/0188065 | A1* | 6/2019 | Anghel | G06N 3/088 |
| 2019/0286506 | A1* | 9/2019 | Cheng | H04L 67/125 |
| 2020/0184341 | A1* | 6/2020 | Ide | G06N 3/088 |

OTHER PUBLICATIONS

Kingma et al. (2014) "Auto-Encoding Variational Bayes" website: https://arxiv.org/abs/1312.6114, 14 pages.
Carl Doersch (2016) "Tutorial on Variational Autoencoders" website: https://arxiv.org/abs/1606.05908, 23 pages.

* cited by examiner

APPARATUS FOR FUNCTIONING AS SENSOR NODE AND DATA CENTER, SENSOR NETWORK, COMMUNICATION METHOD AND PROGRAM

CROSS-REFERENCE TO RELATED APPLICATIONS

This application is a U.S. 371 Application of International Patent Application No. PCT/JP2019/019083, filed on 14 May 2019, which application claims priority to and the benefit of JP Application No. 2018-119234, filed on 22 Jun. 2018, the disclosures of which are hereby incorporated herein by reference in their entireties.

TECHNICAL FIELD

The present invention relates to a sensor network, and more particularly, to a sensor network including a sensor node having not only a sensing/data communication function but also a function for processing sensor data.

BACKGROUND ART

When sensor data observed at sensor nodes is directly transmitted to a data center, if the number of the sensor nodes increases, the volume of communication to the data center may increase to exceed a limit (bandwidth) of communicable volume. Thus, it is considered to process observed sensor data by a sensor node, and detect sensor data only when a classification label is added or when an event to be known has occurred, thereby reducing the volume of communication information to the data center.

In recent years, sensor nodes have come to operate with low power consumption and have not only sensing and communication functions but also a certain amount of information processing functions, which makes it possible to have the classification/detection functions described above. This field is called edge computing (NPL 1).

CITATION LIST

Non Patent Literature

[NPL 1] Aziz Nasridinov, Sun-Young Ihm, Young-Sik Jeong, and Young-Ho Park, "Event Detection in Wireless Sensor Networks: Survey and Challenges", Mobile, Ubiquitous, and Intelligent Computing pp 0.585-590 (2014).
[NPL 2] Diederik P Kingma, Max Welling, "Auto-Encoding Variational Bayes", arXiv: 1312.6114 [stat.ML](2013). https://arxiv.org/abs/1312.6114.
[NPL 3] Carl Doersch, "Tutorial on Variational Autoencoders", arXiv: 1606.05908 [stat.ML](2016). https://arxiv.org/abs/1606.05908.

SUMMARY OF THE INVENTION

Technical Problem

In a method for simply transmitting only a classification label or a detected event to a data center in order to reduce the volume of communication between the sensor and the center, if a classification label or a detected event to be known wants to be changed in the course of operation, a pair of data of sensor data (input) and a classification label (output) serving as learning data is necessary on the data center side where the storage capacity, the processing ability, and power are sufficient. However, sensor data is not provided from a sensor node, and hence there is a problem in that no learning sensor data (input) is provided at the data center.

If there is a classifier/detector on the sensor node side, learning data consisting of pairs of sensor data (input) and classification labels (output) can be accumulated. However, learning a classifier by sensor nodes is not practical because it is difficult to collect the amount of data needed for learning from each sensor node alone, the processing power of the processor on the sensor node makes it difficult to learn large scale data, and the performance of the classifier changes for each sensor node if the learning data is different for each sensor node.

In view of the above-mentioned problems, the present invention has an object to provide a sensor network capable of acquiring, from a data center, learning data composed of a pair of sensor data (input) and a classification label (output) necessary for adding/changing a classification label for updating a classifier while reducing the volume of communication between a sensor and the center.

Means for Solving the Problem

In order to achieve the above-mentioned object, one aspect of the present invention relates to a device, including: an encoding unit for encoding sensor data by an encoder part of an autoencoder; and a transmission unit for transmitting the encoded data.

Another aspect of the present invention relates to a device, including: a reception unit for receiving data encoded from sensor data by an encoder part of an autoencoder; a decoding unit for decoding the encoded data by a decoder part of the autoencoder; and a storage unit for storing the decoded data.

Effects of the Invention

The present invention can provide the sensor network capable of acquiring, from a data center, learning data composed of a pair of sensor data (input) and a classification label (output) necessary for adding/changing a classification label for updating a classifier while reducing the volume of communication between a sensor and the center.

DESCRIPTION OF EMBODIMENTS

In the following examples, a sensor network including a sensor node and a data center is disclosed. The sensor node has an encoder for compressing data, and the data center has a decoder for decompressing compressed data. A classifier/detector for providing a classification label to sensor data or detecting that an event to be known has occurred is provided to the sensor node or the data center.

For example, as an encoder/decoder, an encoder/decoder called "autoencoder" can be used. The compression is non-invertible in general. The autoencoder is an artificial neural network that is provided with learning data in which input data and output data are identical by using observed and accumulated sensor data and learned so as to output the same data as input data as output data. A classifier/detector used for machine learning can be used. As the classifier, a support vector machine (SVM) or a neural network can be used. As the detector, signal detection based on a threshold with which the detection rate is maximized can be used.

An input signal is compressed by an encoder part of an autoencoder disposed at a sensor node, and compressed data is communicated to a data center from the sensor node. In this manner, the volume of communication between the sensor and the center can be reduced, and the compressed data can be restored to the original input data by a decoder part of the autoencoder disposed at the data center.

As described above, not only a classification label as output of the classifier at the sensor node but also input data in the compressed state is transmitted to the data center, and the input data itself is restored at the data center. In this case, a classification label may be output from the sensor node by using the classifier at the same time, and not only sensor data but also the classification label may be collected at the data center at the same time and be used for subsequent relearning as a pair of data of sensor data and classification labels. In this manner, when it is desired to newly allocate a classification label to that other than the classification labels assumed in the beginning, the new classification label may be allocated to the restored input data, and the learning data may be newly added such that the sensor node or the data center can newly relearn only the classifier.

On the other hand, the autoencoder may be relearned by using data that is sufficiently collected for each sensor node, and may be able to restore the input data at the output. Alternatively, the autoencoder may be learned by using all pairs of input and output data instead of separately for each sensor node, and the encoder portion of the autoencoder may be disposed in all sensor nodes, and the decoder portion of the autoencoder may be disposed in the data center as well. In this case, the classification label can be omitted.

[Autoencoder]

Figure 1:
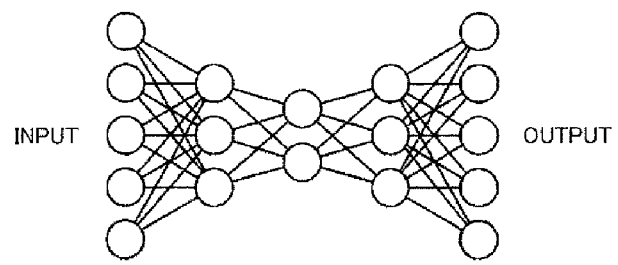
FIG. 1 is a schematic diagram illustrating an autoencoder according to one example of the present invention.

First, an autoencoder (AE) according to one example of the present invention is described with reference to FIG. 1. The autoencoder according to the present example is used as an encoder/decoder for compressing sensor data and transmitting the compressed sensor data to a data center. FIG. 1 is a schematic diagram illustrating the autoencoder according to one example of the present invention.

As illustrated in FIG. 1, the autoencoder is a kind of layered neural networks, and includes an encoder/decoder (see details for NPL 2 and 3, for example). In the illustrated specific example, white circles indicate units in the neural network, and lines among the units indicate weights (links) among the units. In the illustrated specific example, the autoencoder has a five-layer structure, data is output such that output from a five-dimensional input layer passes through three intermediate layers (output is compressed to two dimensions in middle intermediate layers) and the data input to the input layer from the five-dimensional output layer is reproduced. In other words, in an encoder part, the number of units is gradually decreased from the left layer to the right layer in order to compress the dimensions of input data, and in a decoder part, the number of units decreased through the intermediate layers is set to be equal to the number of units in the input layer at the output layer, thereby restoring input information.

In a normal autoencoder, the encoder part and the decoder part are made up of a plurality of layers and are hourglass-shaped, with the intermediate layers in the middle having the fewest units. In an example according to the present invention, information on this least number of units is used to communicate between the sensor node and the data center to reduce the volume of communication. On the sensor node side, an encoder part (layers from input layer to intermediate layer with minimum number of units) is disposed, and on the data center side, a decoder part (layers from intermediate layers following intermediate layer with minimum number of units to output layer) is disposed.

The autoencoder to be used can reproduce the input to the output by learning the sensor data observed at the sensor node in advance as input/output data for learning. In general, the number of learning data for this AE only needs to be sufficient to capture the characteristics of the distribution using data sampled from the expected probability distribution of an event. The data points other than the sample points can be interpolated by the generalization capability of AE.

Various learning methods are conceivable depending on the type of autoencoder to be used. A standard autoencoder is learned by using a learning method for a neural network, such as error backpropagation, and changing the weighting between units so as to reduce a loss function such as a square error between input and output data. Alternatively, a method called variational autoencoder (VAE) can be used. A new loss function may be defined by adding a term such that compressed information in the middle intermediate layer becomes a set probability distribution to the loss function between input and output data in a normal autoencoder, and then the encoder part and the decoder part may become inferential models for obtaining latent variables (information that cannot be obtained directly from classification labels and observations such as handwriting) from observed variables (observed sensor data) and generating models for obtaining observed variables from latent variables, respectively. In this case, various kinds of things can be grasped from the correspondence between compressed information and label information such as numerals.

[Classifier]

Next, a classifier according to one example of the present invention is described with reference to FIG. 2. The classifier according to the present example provides classification labels to observed sensor data. The classifier according to the present example classifies input data into any one of classification labels prepared in advance. Parameters are learned by the classifier by using a set of learning data in which input data prepared in advance for learning and an answer classification label corresponding to the input data.

In the case of adding a new classification label other than learned classification labels or changing a classification label, a set of learning data corresponding to a new classification label is prepared, and the parameters are learned by the classifier again. As the classifier, a well-known machine learning method such as SVM can be used. In the present example, for example, the case where the classifier is configured by a neural network similarly to the autoencoder is described.

Figure 2:
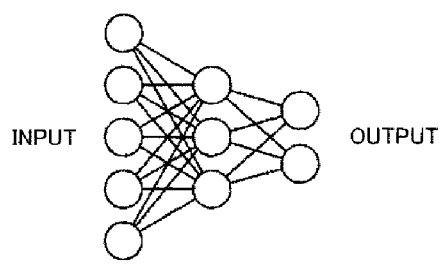
FIG. 2 is a schematic diagram illustrating a neural network used for a classifier according to one example of the present invention.

FIG. 2 is a schematic diagram illustrating a neural network used for the classifier according to one example of the present invention. The classifier in the illustrated example has a three-layer structure including a five-dimensional input layer, a three-dimensional intermediate layer, and a two-dimensional output layer, in which each output unit is allocated with some classification label, and a label indicating a unit having a large output value is determined as a classification label for input data.

In the neural network used for the classifier, in general, as illustrated in FIG. 2, multi-dimensional sensor data is input to the input layer, and classification labels that are exclusively represented are output. Each classification label is allocated to each output unit.

Figure 3:
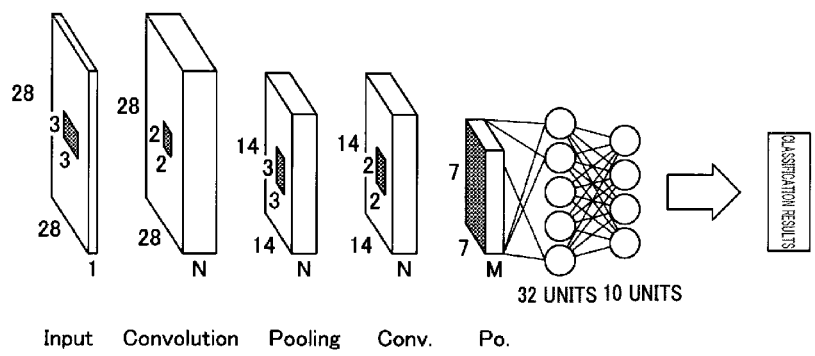
FIG. 3 is a schematic diagram illustrating a convolutional neural network used for the classifier according to one example of the present invention.

As a specific example of the neural network used for the classifier, for example, the neural network may have a structure illustrated in FIG. 3, in which numeral input with 8 bits of a simple matrix of 28×28 is classified into any one of numerals of 0 to 9 as output, and in general, may use the convolutional neural network (CNN) as illustrated in FIG. 3. The CNN is often used for image recognition, and detects two-dimensionally close features for each convolutional layer, and determines a classification label by the last fully connected (FC) layer.

In the illustrated example, the neural network has a seven-layer structure, in which the input layer is a matrix of 28×28 and the output layer indicates ten-dimensional vectors. For a mixed national institute of standards and technology database (MNIST), the output only needs to be allocated with ten numeral labels. N and M of each intermediate layer represented by a rectangular parallelepiped indicate the number of units surfaces, and the hatched square indicates the range of connection (convolution or fully connected (FC)) from the previous layer. The subsequent layer is a fully connected layer that ignores the 2D position in a space, and indicates the number of units.

Figure 4:
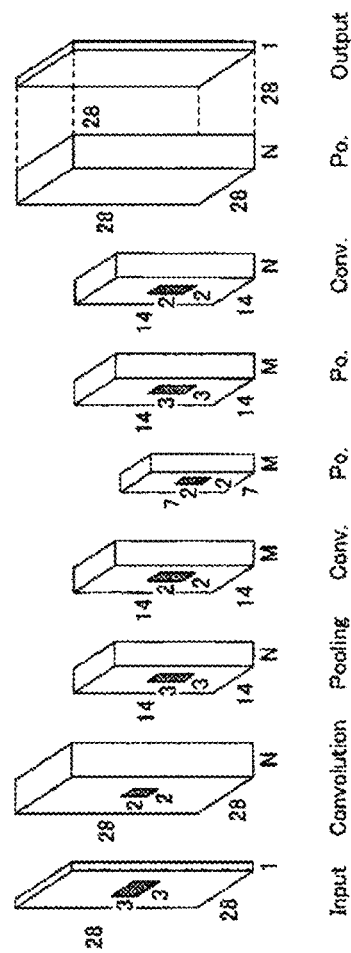
FIG. 4 is a schematic diagram illustrating a convolutional neural network used for the autoencoder according to one example of the present invention.
Figure 5:
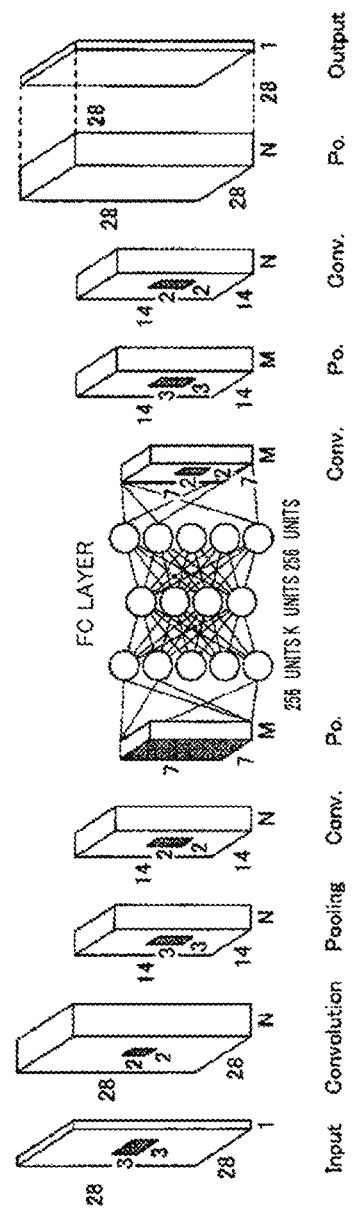
FIG. 5 is a schematic diagram illustrating a convolutional neural network used for the autoencoder according to one example of the present invention.

Note that the CNN used in this example can be applied to an autoencoder as illustrated in FIG. 4, so that the dimensions of information can be reduced to compress information such as features while keeping information on spatial positions. A neural network structured such that a CNN is sandwiched by fully connected layers (FC layers) as illustrated in FIG. 5 may be used for an autoencoder. In the illustrated example, a network having a structure bilaterally symmetrical about the middle intermediate layer is exemplified, but the present invention is not limited thereto. Any form may be employed as long as input and output have the same number of dimensions (number of units), and any network can be used for an autoencoder as long as input data can be restored by the output layer.

Figure 6:
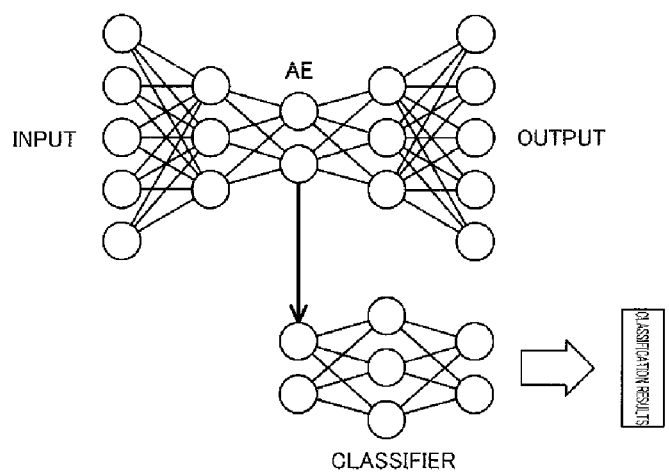
FIG. 6 is a schematic diagram illustrating a classifier that inputs information from an intermediate layer of the autoencoder according to one example of the present invention.

As described in the following examples, the classifier (classification neural network) may classify sensor data by inputting information from an intermediate layer of the autoencoder as illustrated in FIG. 6 unlike the structure in FIG. 3 in which sensor data is input. In other words, this classifier is different from the classifier illustrated in FIG. 3 in that input data is the output from the intermediate layer of the autoencoder (that is, data obtained by compressing input data). In this case, the classifier is learned by using learning data composed of a pair of information on the intermediate layer of the autoencoder and information on an answer classification label.

When a sensor network is operated, sensor nodes are disposed in environments to be observed. To collect data, there is often a request to change/add a classification label later in addition to a classification label first assumed for data. Examples of the cases include a case where it becomes understood from observation results that experimental environments are not conditions expected in the beginning, and the design needs to be changed. In this case, the design on the output side of the classifier is changed to configure a neural network added with an output unit corresponding to a newly considered classification label, and learning data corresponding to the new classification label is used so that the parameters are learned by the neural network again.

In the following, sensor networks according to various examples having the encoder and decoder parts of the autoencoder and/or the classifier are described.

Embodiment 1

First, a sensor network according to Embodiment 1 of the present invention is described with reference to FIGS. 7 to 9. In Embodiment 1, as illustrated in the figures, an encoder part of an autoencoder is disposed at a sensor node 100, and a decoder part of the autoencoder is disposed at a data center 200. Information from the intermediate layer with the minimum number of units is transferred between the sensor node 100 and the data center 200, and consequently, the volume of communication can be reduced as compared with the case where sensor data itself is transmitted to the data center 200.

Figure 7:
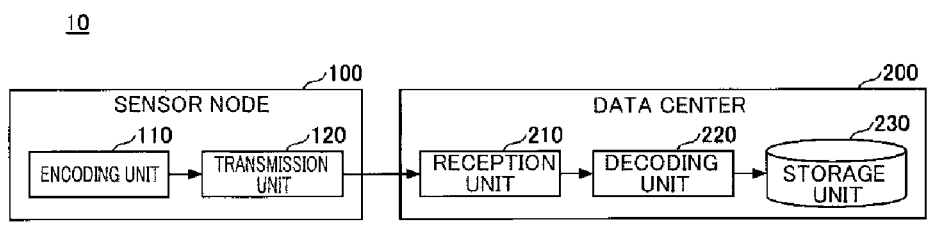
FIG. 7 is a block diagram illustrating a configuration of a sensor network according to Embodiment 1 of the present invention.
Figure 8:
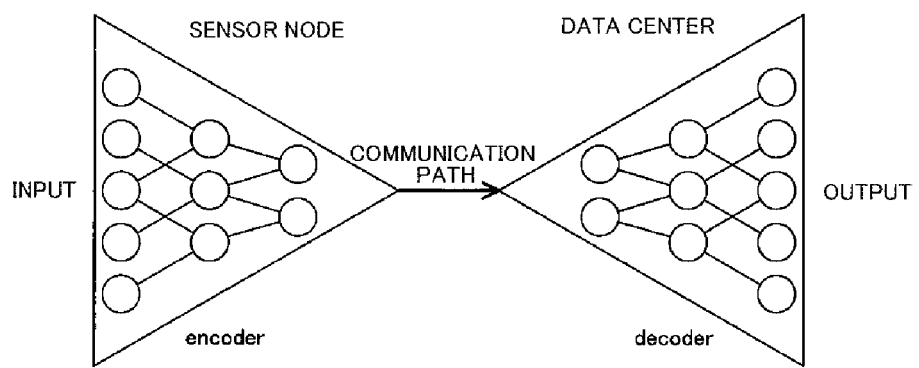
FIG. 8 is a schematic diagram illustrating an autoencoder according to Embodiment 1 of the present invention.

FIG. 7 is a block diagram illustrating the configuration of the sensor network according to Embodiment 1 of the present invention. As illustrated in FIG. 7, a sensor network 10 includes the sensor node 100 and the data center 200. The sensor node 100 includes an encoding unit 110 and a transmission unit 120, and the data center 200 includes a reception unit 210, a decoding unit 220, and a storage unit 230.

The encoding unit 110 encodes sensor data by the encoder part of the autoencoder. Specifically, the encoding unit 110 encodes sensor data collected by sensor means by an encoder part of an autoencoder as illustrated in FIG. 8, and provides the encoded sensor data to the transmission unit 120 for transmitting the encoded data to the data center 200.

Note that an autoencoder to be used may be a standard autoencoder illustrated in FIG. 1 or an autoencoder (CNN-AE) or a VAE formed by a CNN illustrated in FIG. 4. In addition, a conditional VAE (CVAE) in which classification labels are input to an encoder part and a decoder part of the VAE and considered as conditional probability may be used. In this case, the classifier is prepared on the sensor node side, and its label output is input to the encoder part and the decoder part of the CVAE, and hence classification labels need to be prepared by the classifier in advance. Another type (CNN+FC-AE) as illustrated in FIG. 5 in which CNNs are included in layers on both sides of input and output and fully connected (FC) layers are used as intermediate layers is conceivable.

The transmission unit 120 transmits encoded data. Specifically, the transmission unit 120 transmits data encoded from sensor data by the encoding unit 110 to the data center 200. Encoded data may be transmitted from the sensor node 100 to the data center 200 by wired communication, wireless communication, or a combination thereof.

The reception unit 210 receives data encoded from the sensor data by the encoder part of the autoencoder. Specifically, the reception unit 210 receives, from the sensor node 100, data encoded from collected sensor data by the encoder part of the autoencoder provided to the sensor node 100, and provides the data to the decoding unit 220.

The decoding unit 220 decodes the encoded data by a decoder part of the autoencoder. Specifically, the decoding unit 220 restores the encoded data provided from the reception unit 210 by the decoder part corresponding to the encoder part of the autoencoder provided to the sensor node 100 as illustrated in FIG. 8.

The storage unit 230 stores the decoded data therein. Specifically, the storage unit 230 holds the data restored by the decoding unit 220 as data for subsequent learning.

In the example illustrated in FIG. 7, one sensor node 100 is communicably connected to the data center 200, but the present invention is not limited thereto. As illustrated in FIG. 9, a plurality of sensor nodes 100 may be communicably connected to the data center 200, and the data center 200 may receive and decode encoded data from each sensor node 100.

Figure 9:
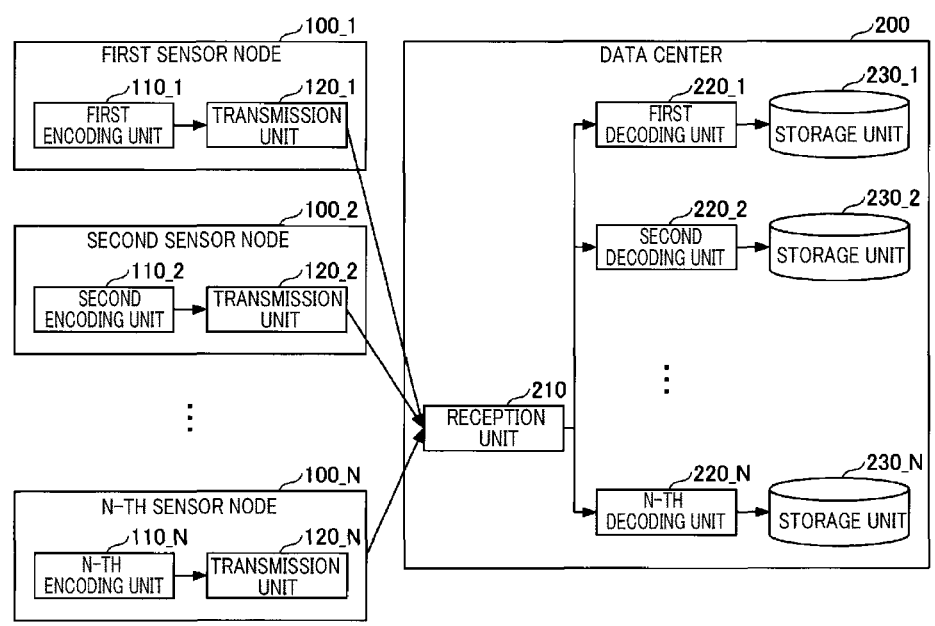
FIG. 9 is a block diagram illustrating a configuration of a modification of the sensor network according to Embodiment 1 of the present invention.

In the example illustrated in FIG. 9, each of N sensor nodes 100_1, . . . , and 100_N encodes collected sensor data, and transmits the encoded data to the data center 200. The data center 200 receives the encoded data transmitted from each of the sensor nodes 100_1, . . . , and 100_N by the reception unit 210, and decodes the encoded data in a corresponding one of decoding units 220_1, . . . , and 220_N. Note that each of the first encoding unit 110_1, . . . , and the N-th encoding unit 110_N has the same configuration as that of the above-mentioned encoding unit 110, and each of the first decoding unit 220_1, . . . , and the N-th decoding unit 220_N may have the same configuration as that of the above-mentioned decoding unit 220.

In this case, each of the first encoding unit 110_1, . . . , the N-th encoding unit 110_N may have an encoder part with common parameters, and correspondingly, each of the first decoding unit 220_1, . . . , and the N-th decoding unit 220_N may have a decoder part with corresponding common parameters. Note that, in this case, the first decoding unit 220_1, . . . , and the N-th decoding unit 220_N may be collectively configured as one decoding unit 220.

Alternatively, each of the first encoding unit 110_1, . . . , and the N-th encoding unit 110_N may have an encoder part with different parameters, and correspondingly, each of the first decoding unit 220_1, . . . , and the N-th decoding unit 220_N may have a decoder part with corresponding different parameters. The sensor nodes 100 have deviation in collected sensor data depending on arrangement environments, and hence when an encoder part belonging to an autoencoder learned based on learning data corresponding to environments, data can be compressed with a higher compression rate than when an encoder part learned by common learning data, and hence more efficient communication between the center and the sensor can be expected by the illustrated configuration.

Embodiment 2

Next, a sensor network according to Embodiment 2 of the present invention is described with reference to FIGS. 10 and 11. In Embodiment 2, as compared with Embodiment 1, as illustrated in the figures, a classifier 240 is disposed at a data center 200, and a classification label is determined based on classification label restored at the data center 200.

Figure 10:
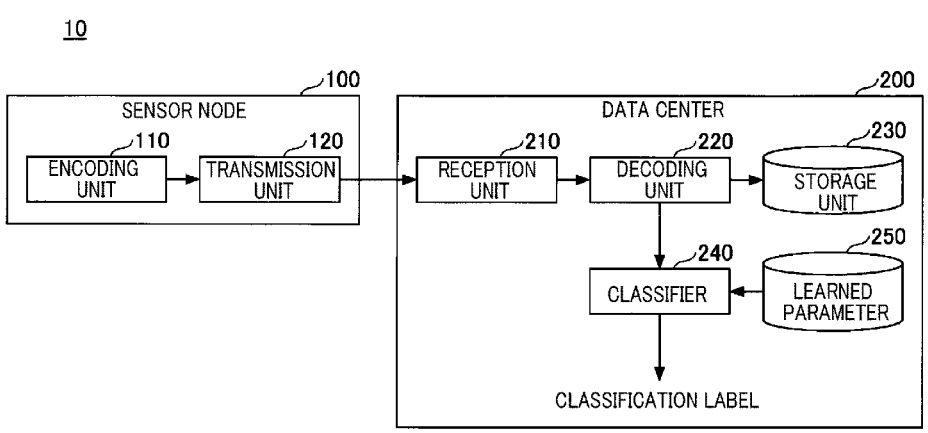
FIG. 10 is a block diagram illustrating a configuration of a sensor network according to Embodiment 2 of the present invention.
Figure 11:
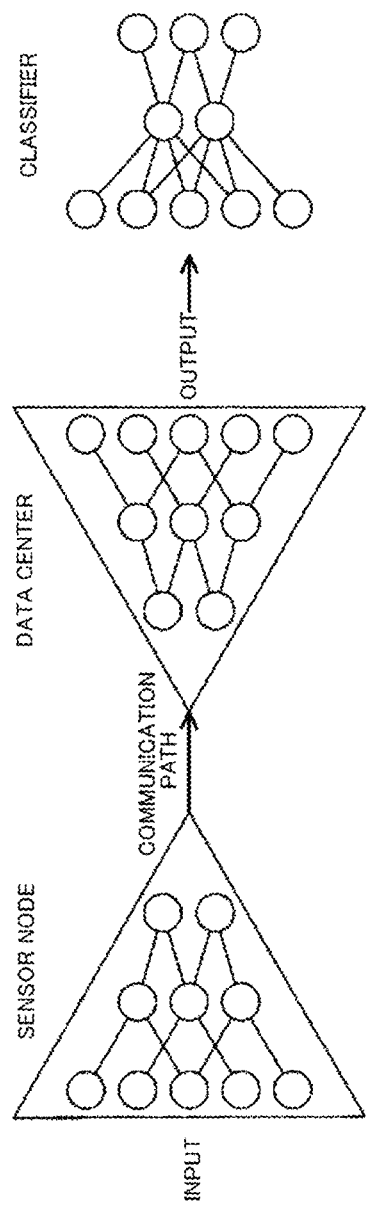
FIG. 11 is a schematic diagram illustrating a classifier according to Embodiment 2 of the present invention.

FIG. 10 is a block diagram illustrating a configuration of the sensor network according to Embodiment 2 of the present invention. As illustrated in FIG. 10, a sensor node 100 includes an encoding unit 110 and a transmission unit 120, and a data center 200 includes a reception unit 210, a decoding unit 220, a storage unit 230, a classifier 240, and a learned parameter storage unit 250. The encoding unit 110, the transmission unit 120, the reception unit 210, the decoding unit 220, and the storage unit 230 are the same as in Embodiment 1, and overlapping descriptions are omitted.

The classifier 240 classifies sensor data based on decoded data. Specifically, as illustrated in FIG. 11, the classifier 240 has a learned model such as the above-mentioned neural network, and inputs restored sensor data output from the decoding unit 220 and outputs a classification label corresponding to the sensor data. In the present example, the parameters of the learned model of the classifier 240 are parameters learned from the learning data in advance and stored in the learned parameter storage unit 250.

According to the present example, input sensor data is reproduced by the output from the decoder part of the autoencoder, and hence by inputting restored sensor data to the classifier 240, a pair of data of sensor data and a corresponding classification label can be acquired at the data center 200. Consequently, the data center 200 can use sensor data restored by the decoding unit 220 to generate a set of learning data composed of a new classification label and corresponding restored sensor data. Thus, the data center 200 can use the generated learning data set to cause the classifier 240 to learn a new model again, and the classifier 240 capable of classifying sensor data into more appropriate new classification labels can be configured again.

Embodiment 3

Next, a sensor network according to Embodiment 3 of the present invention is described with reference to FIGS. 12 and 13. In Embodiment 3, as compared with Embodiment 1, as illustrated in the figures, a classifier 130 is disposed at a sensor node 100, and a classification label is determined based on sensor data acquired by the sensor node 100.

Figure 12:
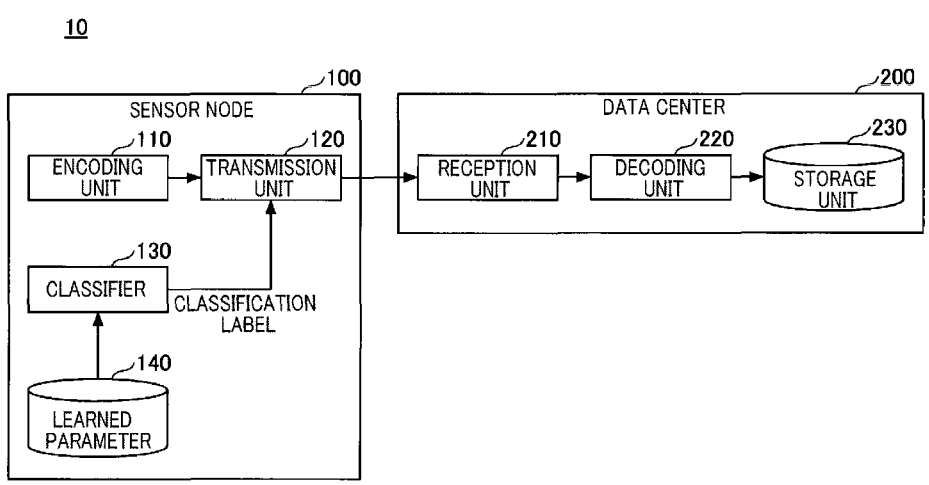
FIG. 12 is a block diagram illustrating a configuration of a sensor network according to Embodiment 3 of the present invention.
Figure 13:
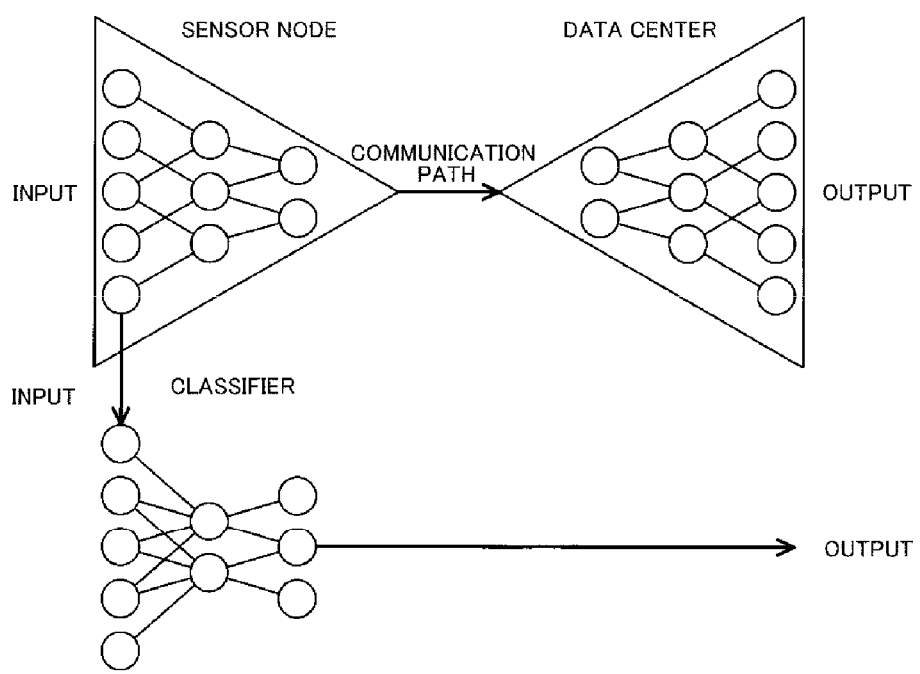
FIG. 13 is a schematic diagram illustrating a classifier according to Embodiment 3 of the present invention.

FIG. 12 is a block diagram illustrating a configuration of the sensor network according to Embodiment 3 of the present invention. As illustrated in FIG. 12, the sensor node 100 includes an encoding unit 110, a transmission unit 120, a classifier 130, and a learned parameter storage unit 140, and a data center 200 includes a reception unit 210, a decoding unit 220, and a storage unit 230. The encoding unit 110, the transmission unit 120, the reception unit 210, the decoding unit 220, and the storage unit 230 are the same as in Embodiment 1, and overlapping descriptions are omitted.

The classifier 130 classifies sensor data based on the sensor data. Specifically, as illustrated in FIG. 13, the classifier 130 has a learned model such as the above-mentioned neural network, and inputs collected sensor data and outputs a classification label corresponding to sensor data. In the present example, parameters of the learned model in the classifier 130 are parameters learned from learning data in advance, and are stored in the learned parameter storage unit 140. The transmission unit 120 transmits encoded data and a result of the classification to the data center 200. When the data center 200 receives the encoded data and the result of the classification, the data center 200 may decode the received encoded data, and store the restored sensor data and the received result of the classification in the storage unit 230 in association with each other.

In this manner, the output of the intermediate layer of the autoencoder and the output of the classification label of the classifier 130 at the sensor node 100 are transmitted to the data center 200, and hence the data center 200 can acquire sensor data restored by the output of the decoder part, and acquire a pair of data of the sensor data and its classification label. Consequently, the data center 200 can acquire learning data corresponding to a new classification label, and the learning data can be used to relearn the classifier at the data center 200. By transmitting the learned parameters to the sensor node 100, the sensor node 100 can update the classifier 130. In this arrangement, a CVAE can be used as an autoencoder. Note that, in this case, the classifier 130 transmits a classification label to the encoding unit 110, and the encoding unit 110 uses the acquired classification label to execute encoding.

Embodiment 4

Next, a sensor network according to Embodiment 4 of the present invention is described with reference to FIGS. 14 and 15. In Embodiment 4, as compared with Embodiment 1, as illustrated in the figures, a classifier 240 is disposed at a data center 200, and a classification label is determined based on encoded data provided from a sensor node 100.

Figure 14:
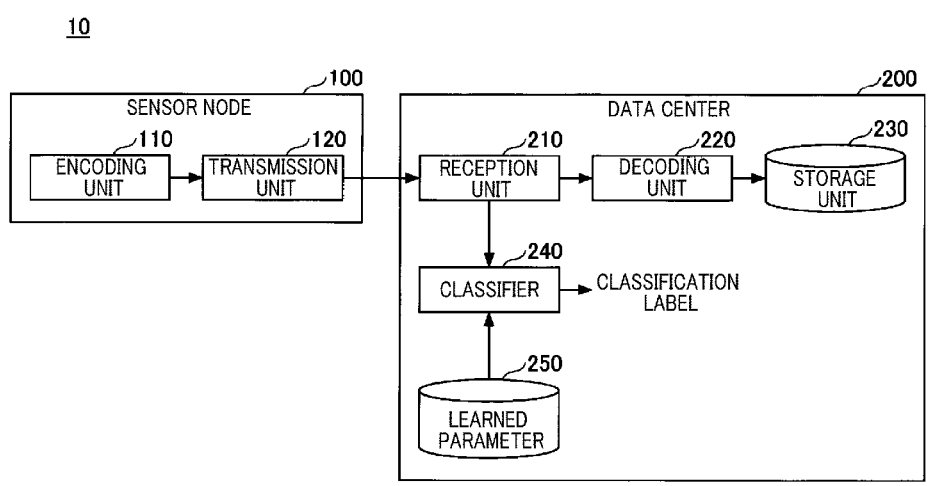
FIG. 14 is a block diagram illustrating a configuration of a sensor network according to Embodiment 4 of the present invention.
Figure 15:
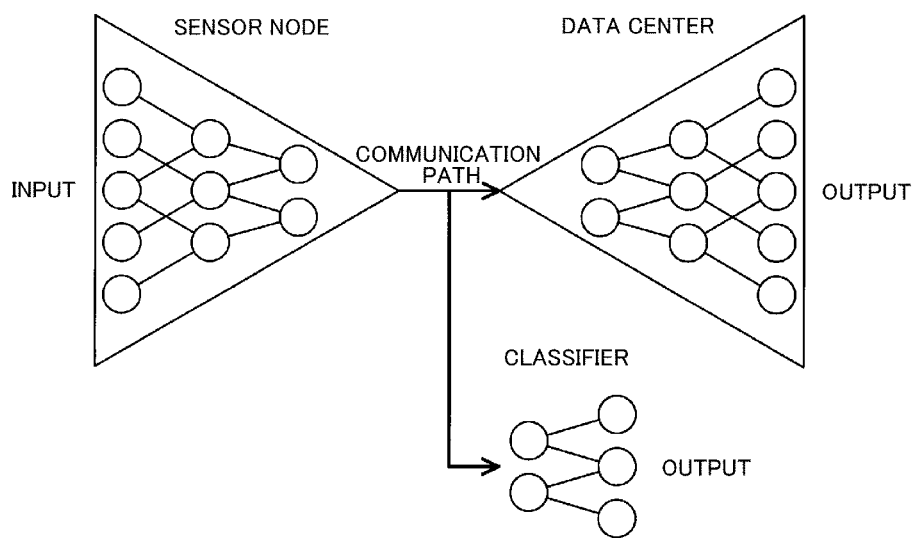
FIG. 15 is a schematic diagram illustrating a classifier according to Embodiment 4 of the present invention.

FIG. 14 is a block diagram illustrating a configuration of the sensor network according to Embodiment 4 of the present invention. As illustrated in FIG. 14, the sensor node 100 includes an encoding unit 110 and a transmission unit 120, and the data center 200 includes a reception unit 210, a decoding unit 220, a storage unit 230, a classifier 240, and a learned parameter storage unit 250. The encoding unit 110, the transmission unit 120, the reception unit 210, the decoding unit 220, and the storage unit 230 are the same as in Embodiment 1, and overlapping descriptions are omitted.

The classifier 240 classifies sensor data based on encoded data. Specifically, as illustrated in FIG. 15, the classifier 240 has a learned model such as the above-mentioned neural network, and inputs encoded data provided from the reception unit 210 and outputs a classification label corresponding to sensor data. In the present example, parameters of the learned model in the classifier 240 are parameters learned from learning data in advance, and are stored in the learned parameter storage unit 250.

According to the present example, encoded data provided from the sensor node 100 is input to the classifier 240, and hence the data center 200 can acquire a pair of data of sensor data restored by the decoding unit 220 and a corresponding classification label. Consequently, the data center 200 can use the restored sensor data acquired by the decoding unit 220 to generate a set of learning data composed of a new classification label and corresponding restored sensor data. Thus, by using the generated learning data set, the data center 200 can relearn the model of the classifier 240, and the classifier 240 capable of classifying sensor data into more appropriate classification labels can be configured again.

Embodiment 5

Next, a sensor network according to Embodiment 5 of the present invention is described with reference to FIGS. 16 and 17. In Embodiment 5, as compared with Embodiment 1, as illustrated in the figures, a classifier 130 is disposed at a sensor node 100, a classification label is determined based on data encoded at a sensor node 100.

Figure 16:
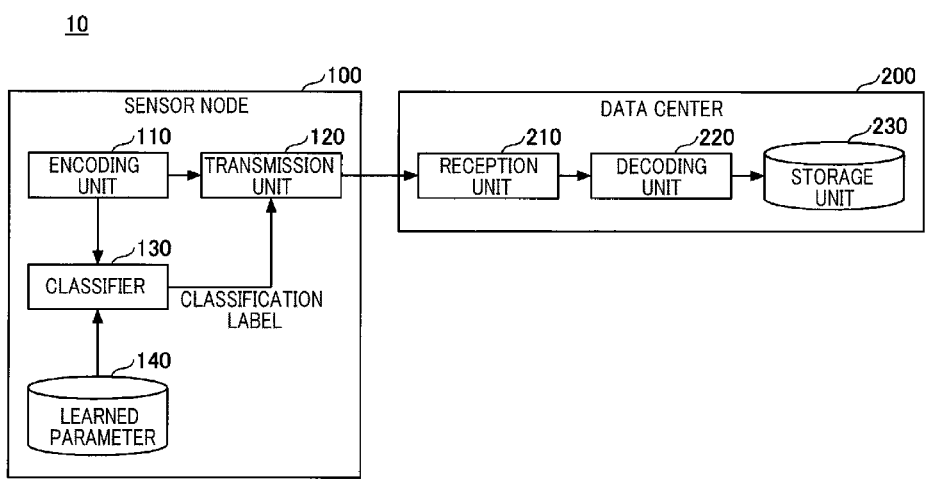
FIG. 16 is a block diagram illustrating a configuration of a sensor network according to Embodiment 5 of the present invention.
Figure 17:
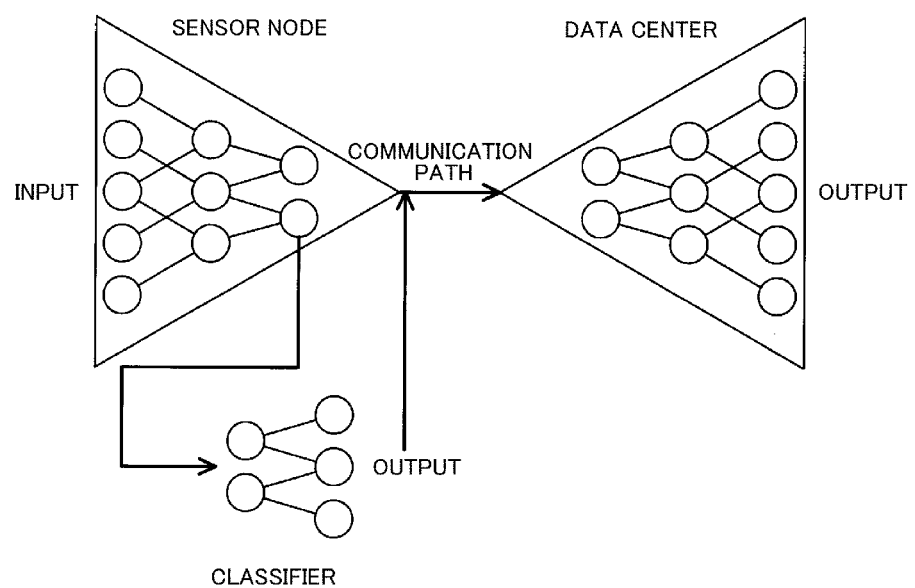
FIG. 17 is a schematic diagram illustrating a classifier according to Embodiment 5 of the present invention.

FIG. 16 is a block diagram illustrating a configuration of the sensor network according to Embodiment 5 of the present invention. As illustrated in FIG. 15, the sensor node 100 includes an encoding unit 110, a transmission unit 120, a classifier 130, and a learned parameter storage unit 140, and the data center 200 includes a reception unit 210, a decoding unit 220, and a storage unit 230. The encoding unit 110, the transmission unit 120, the reception unit 210, the decoding unit 220, and the storage unit 230 are the same as in Embodiment 1, and overlapping descriptions are omitted.

The classifier 130 classifies sensor data based on encoded data. Specifically, as illustrated in FIG. 17, the classifier 130 has a learned model such as the above-mentioned neural network, and inputs data encoded in the encoding unit 110 and outputs a classification label corresponding to sensor data. In the present example, parameters of the learned model in the classifier 130 are parameters learned from learning data in advance, and are stored in the learned parameter storage unit 140. The transmission unit 120 transmits encoded data and a result of the classification to the data center 200. When the data center 200 receives the encoded data and the result of the classification, the data center 200 may decode the received encoded data, and store the restored sensor data and the received result of the classification in the storage unit 230 in association with each other.

In this manner, the output of the intermediate layer of the autoencoder and a classification label output from the classifier 130 of the sensor node 100 are transmitted to the data center 200, and hence the data center 200 can acquire sensor data restored by the output of the decoder part, and acquire a pair of data of the sensor data and its classification label. Consequently, the data center 200 can acquire learning data corresponding to a new classification label, and by using the learning data, the data center 200 can relearn the classifier and transmit the learned parameters to the sensor node 100, so that the sensor node 100 can update the classifier 130.

Embodiment 6

Next, a sensor network according to Embodiment 6 of the present invention is described with reference to FIG. 18. In Embodiment 6, as compared with Embodiment 1, as illustrated in the figure, a relay 300 is provided between a sensor node 100 and a data center 200, a classifier 320 is disposed in the relay 300, and a classification label is determined based on data encoded by the relay 300. For example, in edge computing, information from a plurality of sensor nodes is once aggregated in the relay 300, and transmitted to the data center 300. The relays 300 may be provided in multiple stages, and data for each area may be aggregated and gradually transmitted to the data center 200.

Figure 18:
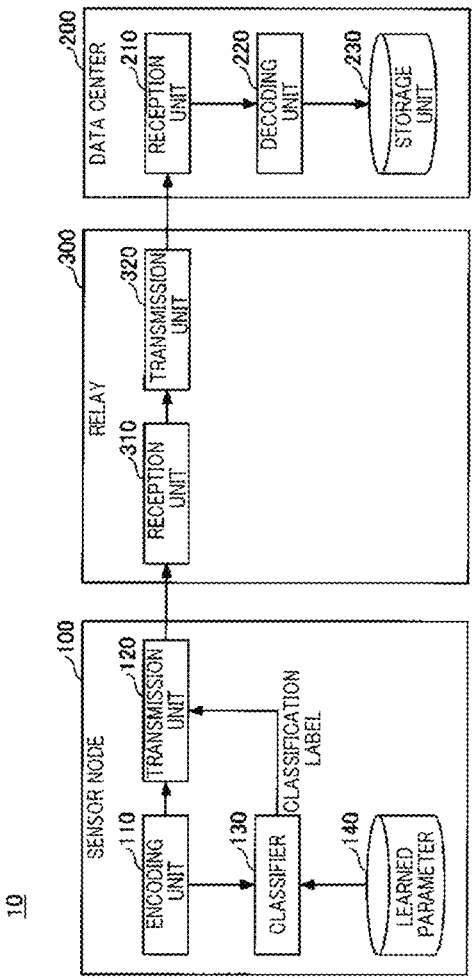
FIG. 18 is a block diagram illustrating a configuration of a sensor network according to Embodiment 6 of the present invention.

FIG. 18 is a block diagram illustrating a configuration of the sensor network according to Embodiment 6 of the present invention. As illustrated in FIG. 18, the sensor node 100 includes an encoding unit 110, a transmission unit 120, a classifier 130, and a learned parameter storage unit 140, the data center 200 includes a reception unit 210, a decoding unit 220, and a storage unit 230, and the relay 300 includes a reception unit 310 and a transmission unit 320. The encoding unit 110, the transmission unit 120, the classifier 130, the learned parameter storage unit 140, the reception unit 210, the decoding unit 220, and the storage unit 230 are the same as in Embodiment 5, and overlapping descriptions are omitted.

The reception unit 310 receives encoded data from the sensor node 100. Specifically, the reception unit 310 receives data encoded by the encoder part of the autoencoder from sensor data collected at the sensor node 100 and a classification label corresponding to the sensor data, and provides the received encoded data and the received classification label to the transmission unit 320.

The transmission unit 320 transmits the encoded data and the classification label to the data center 200. When the data center 200 receives the encoded data and the result of the classification, the data center 200 may decode the received encoded data, and store the restored sensor data and the received result of the classification in the storage unit 230 in association with each other.

Figure 19:
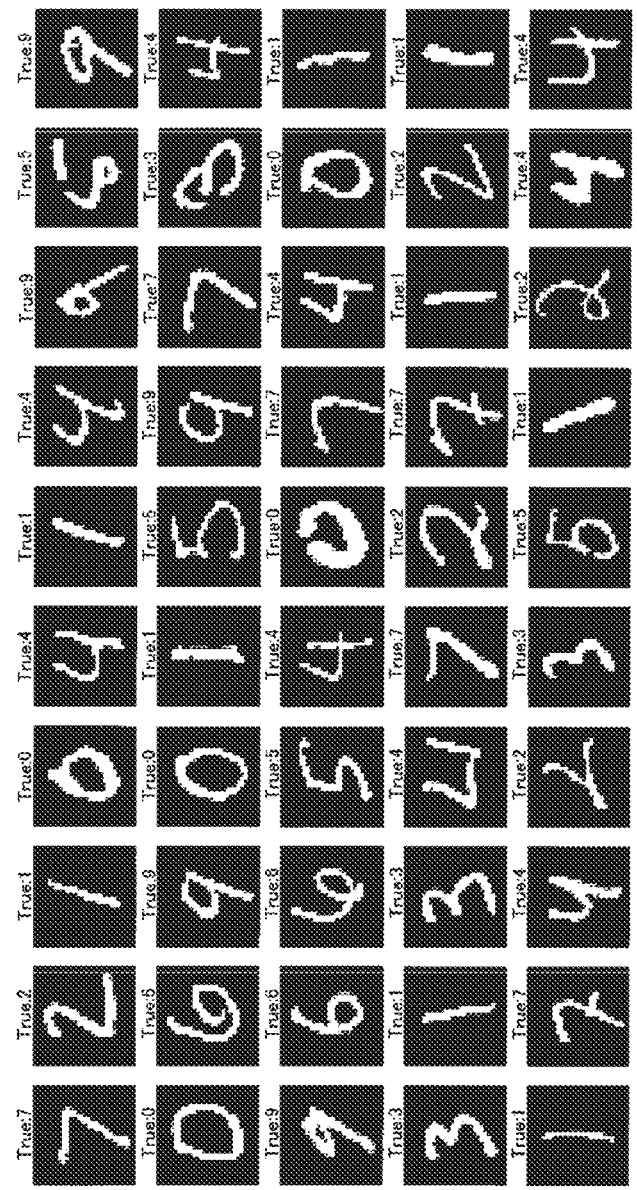
FIG. 19 illustrates handwritten numerical data of MNIST and classification labels.

Next, experimental results using the sensor network according to one embodiment of the present invention are described with reference to FIGS. 19 to 21. Handwritten numeric data (http://yann.lecun.com/exdb/mnist/), which is commonly used as data in the field of supervised machine learning called MNIST, as illustrated in FIG. 19, was used to indicate the experimental results. This data is from 0 to 9, such that a value of 0 to 255 (8 bits) is allocated to each of the 28×28 matrix and numerals 0 to 9 as illustrated are handwritten numeric data as classification labels, and a total of 60,000 data (50,000 for learning and 10,000 for testing) are used. In this example, on the assumption that the sensor data observed at the sensor node 100 is 8-bit handwritten numeric data of the 28×28 matrix, the data center 200 determines the corresponding classification label. In other words, the image of a handwritten digit taken by a camera (sensor) is the input data, and the data center 200 wants to output the classification.

Figure 20:
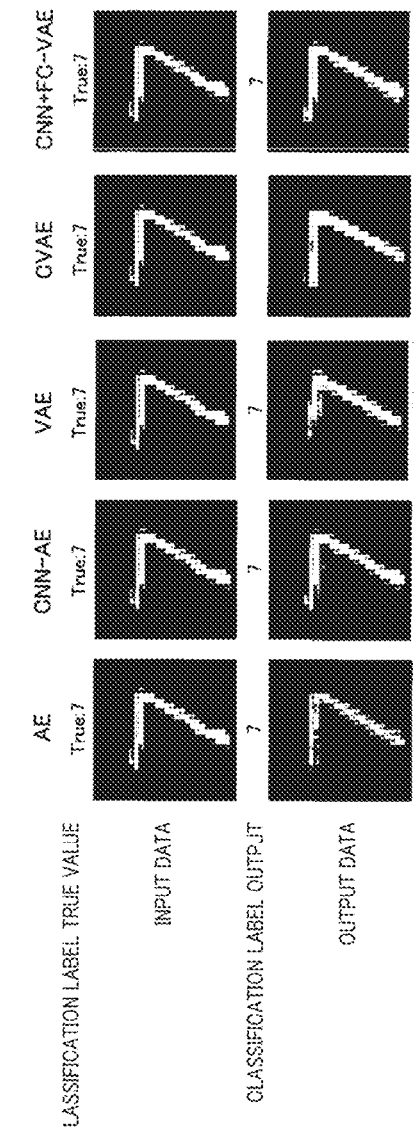
FIG. 20 is a diagram illustrating results by the autoencoder and the classifier according to the present invention.

FIG. 20 is a diagram illustrating results by the autoencoder and the classifier according to the present invention. FIG. 20 illustrates an input numeral pattern and true values of its classification labels, and a numeral pattern output from the autoencoder and classification labels output from the classifier. The numeral patterns restored from input numeral patterns by various autoencoders (AE, CNN-AE, VAE, CVAE and CNN+FC-VAE) are illustrated, and the classifier in Embodiment 4, which classifies from the output of the middle intermediate layer with the smallest number of units, was used as the classifier. In CVAE, there is no label output of the classifier because the classification label is given in advance. These results indicate that the combination of various autoencoders and classifiers can be used to reproduce and classify sensor data.

Figure 21:
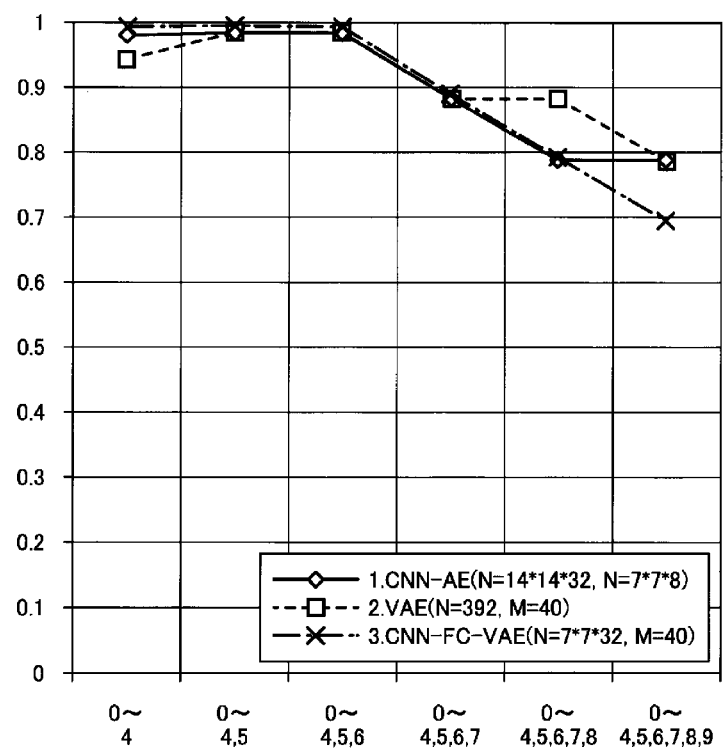
FIG. 21 is a diagram illustrating a change in recognition rate when a classification label is added according to the present invention.

FIG. 21 illustrates the recognition rate when the classifier was relearned by changing the learning data from the six classification labels of 0, 1, 2, 3, 4 and other classifications to ten classifications from 0 to 9. When a classification label is added, the recognition rate often falls, but it can be made to function without falling to chance level.

As described above, this technology can be used to compress sensor data by various autoencoders and classifiers and relearn the classifier.

The sensor node 100, the data center 200, and the relay 300 may be typically implemented by a calculation device having a communication function, and for example, may be configured from an auxiliary storage device, a memory device, a processor, an interface device, and a communication device. Various kinds of computer programs including programs for implementing various kinds of functions and processing in the sensor node 100, the data center 200, and the relay 300 may be provided by a recording medium such as a compact disk-read only memory (CD-ROM), a digital versatile disk (DVD), and a flash memory. The programs may be installed or downloaded to the auxiliary storage device. The auxiliary storage device stores installed programs together with necessary files and data. When an instruction to start the memory device and a program is issued, the program and data are read from the auxiliary storage device and stored. The processor executes various kinds of functions and processing in the above-mentioned calculation device 100 in accordance with the programs stored in the memory device and various kinds of data such as parameters necessary for executing the programs. The interface device is used as a communication interface for connection to a network or an external device. The communication device executes various kinds of communication processing for communicating to a network such as the Internet.

However, the sensor node 100, the data center 200, and the relay 300 are not limited to the above-mentioned hardware configurations, and may be implemented by other appropriate hardware configurations.

While the examples of the present invention have been described above in detail, the present invention is not limited to the above-mentioned particular embodiments, and can be variously modified and changed within the range of the gist of the present invention described in the claims.

REFERENCE SIGNS LIST

100 Sensor node
200 Data center
300 Relay

The invention claimed is:

1. A device, comprising a processor configured to execute operations comprising:
   encoding sensor data using a first neural network;
   determining, based on the sensor data, a class associated with the sensor data using a second neural network; and
   transmitting a combination including label data indicating the class and the encoded data as training data over a network, causing decoding of the encoded data and further causing, based on the training data, training of the second neural network and a third neural network, wherein the second neural network, when trained, receives the encoded data as input, decodes the encoded data into decoded data as output, and associates the decoded data with the class, and wherein the third neural network, when trained, receives the encoded data as input and determines the class as output.

2. The device according to claim 1, further comprising: determining, based on the sensor data, the class using machine learning.

3. The device according to claim 1, wherein the first neural network comprises:
an input layer, and
one or more intermediate layers from an intermediate layer subsequent to the input layer.

4. A device comprising a processor configured to execute operations comprising:
receiving encoded data;
receiving a class label of a class associated with the encoded data; and
decoding the encoded data to generate decoded data;
associating the decoded data and the class label; and
storing the decoded data.

5. The device according to claim 4, the processor further configured to execute operations comprising:
determining, using the sensor data based on at least one of the encoded data or the decoded data, a class associated with the sensor data, wherein the storing further comprises storing the class.

6. The device according to claim 4, wherein the determining a class uses the stored decoded data as training data.

7. The device according to claim 4, wherein the decoding uses a neural network, and wherein the neural network includes: one or more intermediate layers subsequent to an intermediate layer of the neural network, and an output layer.

8. A communication method, comprising:
encoding, by a sensor node, sensor data using a first part of a first neural network;
determining a class associated with the sensor data;
transmitting, by the sensor node, a combination including the class and the encoded data over a network;
causing receiving, by a data center, the combination including the class and the encoded data;
causing decoding, by the data center, the encoded data a second part of the first neural network; and
causing storing, by the data center.

9. The device according to claim 2, wherein the neural network includes:
an input layer, and
one or more intermediate layers from an intermediate layer subsequent to the input layer.

10. The device according to claim 5, wherein the generating the class uses a neural network, and the neural network is trained using the decoded data.

11. The device according to claim 5, wherein the decoding uses a neural network, and wherein the neural network includes: one or more intermediate layers subsequent to an intermediate layer and an output layer.

12. The device according to claim 6, wherein the decoder part includes: one or more intermediate layers subsequent to an intermediate layer and an output layer.

13. The communication method of claim 8, the method further comprising:
determining a class associated with the sensor data based on at least one of the sensor data or the encoded data; and
transmitting the encoded data and a class label indicating the class.

14. The communication method of claim 8,
wherein the neural network includes:
an input layer, and
one or more intermediate layers from an intermediate layer subsequent to the input layer.

15. The communication method of claim 8, the method further comprising:
determining the class based on at least one of the encoded data or the decoded data; and
storing the decoded data and a class label indicating the class.

16. The communication method of claim 8, wherein the determining the class using the sensor data is associated with learning a neural network using the decoded data.

17. The communication method of claim 8, wherein the decoding uses a neural network, and wherein the neural network includes: one or more intermediate layers subsequent to an intermediate layer of the neural network, and an output layer of the autoencoder.

18. The communication method of claim 15, wherein the decoding uses a neural network, and wherein the neural network includes: one or more intermediate layers subsequent to an intermediate layer and an output layer.

19. The device of claim 1, wherein the device represents at least in part a sensor node of a sensor network, wherein the sensor node encodes the sensor data received by the sensor node and transmits the encoded sensor data and a classification associated with the sensor data to a data center over the sensor network.

20. The device of claim 4, wherein the device represents at least in part a data center of a sensor network, wherein the data center receives encoded sensor data and a classification label associated with the encoded sensor data from a sensor node over the sensor network and decodes the received encoded sensor data.

* * * * *